(12) United States Patent
Leshniak

(10) Patent No.: US 11,935,877 B2
(45) Date of Patent: Mar. 19, 2024

(54) THERMAL MANAGEMENT FOR PACKAGE ON PACKAGE ASSEMBLY

(71) Applicant: Applied Materials, Inc., Santa Clara, CA (US)

(72) Inventor: Itai Leshniak, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/354,078

(22) Filed: Jun. 22, 2021

(65) Prior Publication Data
US 2022/0406761 A1    Dec. 22, 2022

(51) Int. Cl.
*H01L 25/10* (2006.01)
*H01L 23/373* (2006.01)
*H01L 25/18* (2023.01)

(52) U.S. Cl.
CPC ........ *H01L 25/105* (2013.01); *H01L 23/3731* (2013.01); *H01L 25/18* (2013.01); *H01L 2225/1041* (2013.01); *H01L 2225/1094* (2013.01)

(58) Field of Classification Search
None
See application file for complete search history.

(56) References Cited

U.S. PATENT DOCUMENTS

2019/0273030 A1*  9/2019  Lim .................... H01L 23/3675
2020/0058571 A1*  2/2020  Wang .................. H01L 23/433

* cited by examiner

*Primary Examiner* — Hung K Vu
(74) *Attorney, Agent, or Firm* — Kilpatrick Townsend & Stockton LLP

(57) ABSTRACT

Exemplary package on package (PoP) assemblies may include a substrate. The PoP assemblies may include a first package positioned on a first side of the substrate with a bottom surface of the first package facing the substrate. The PoP assemblies may include a second package positioned on a second side of the substrate with a top surface of the second package facing the substrate. The second side may be positioned opposite the first side. The PoP assemblies may include a conductive element that contacts one or both of a top surface and the bottom surface of the second package and extends to a position that is aligned with or above a top surface of the first package.

20 Claims, 8 Drawing Sheets

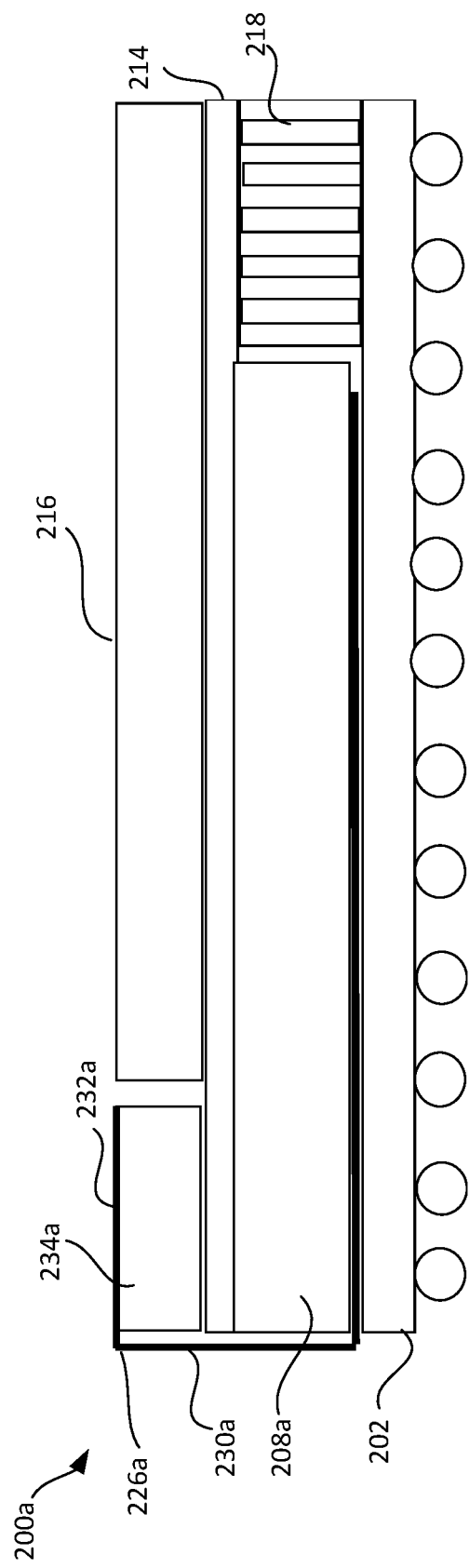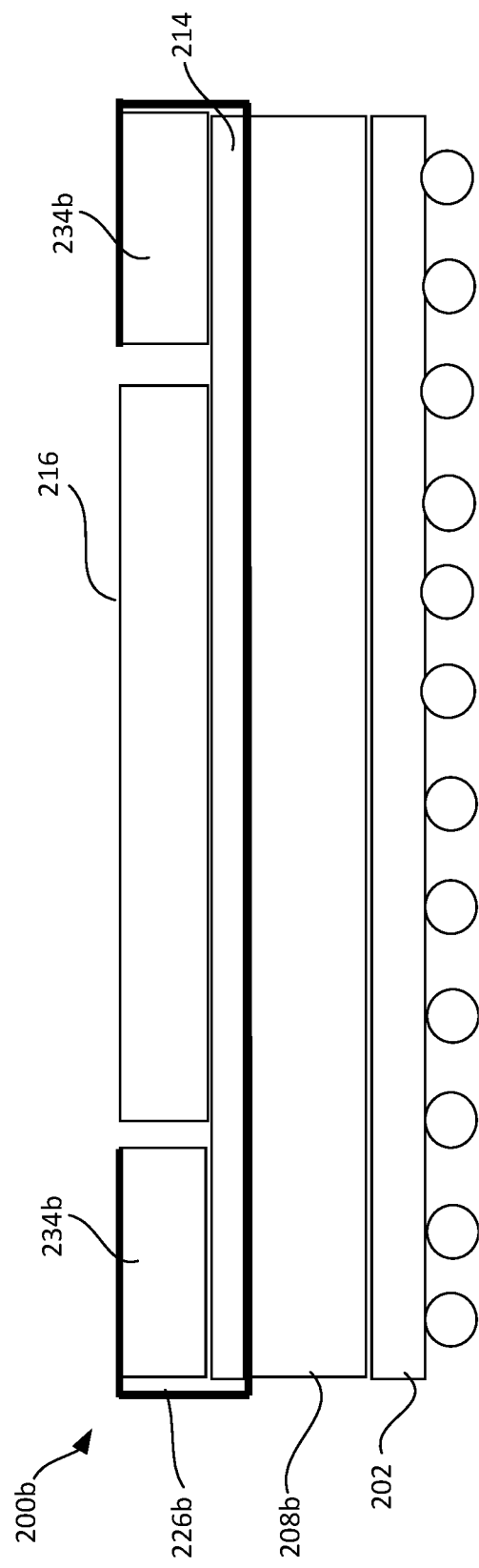

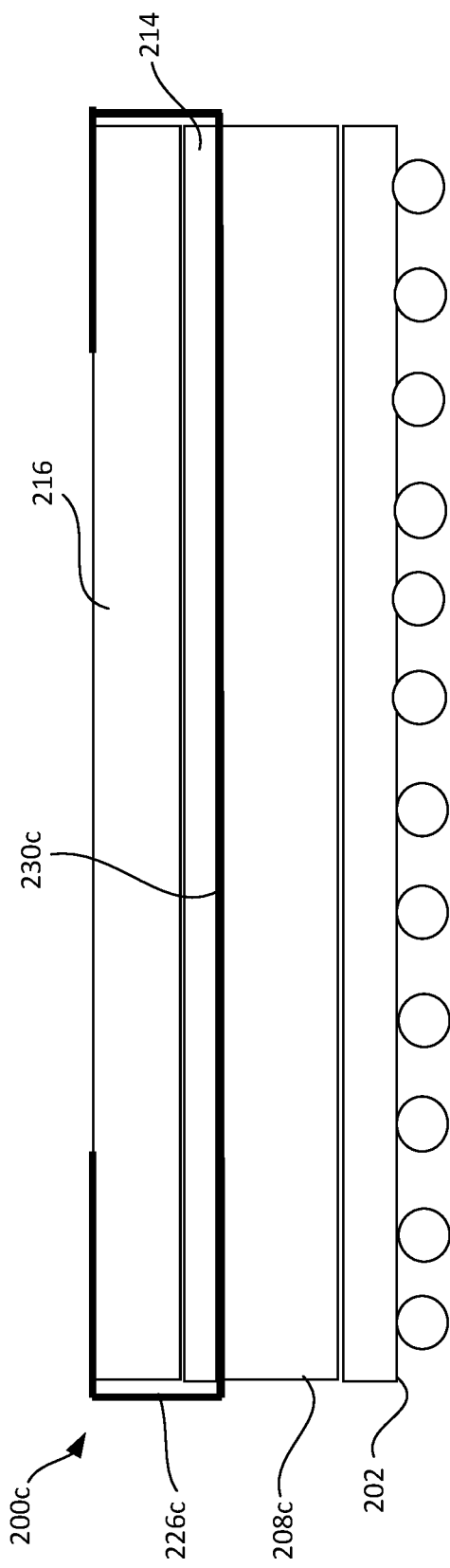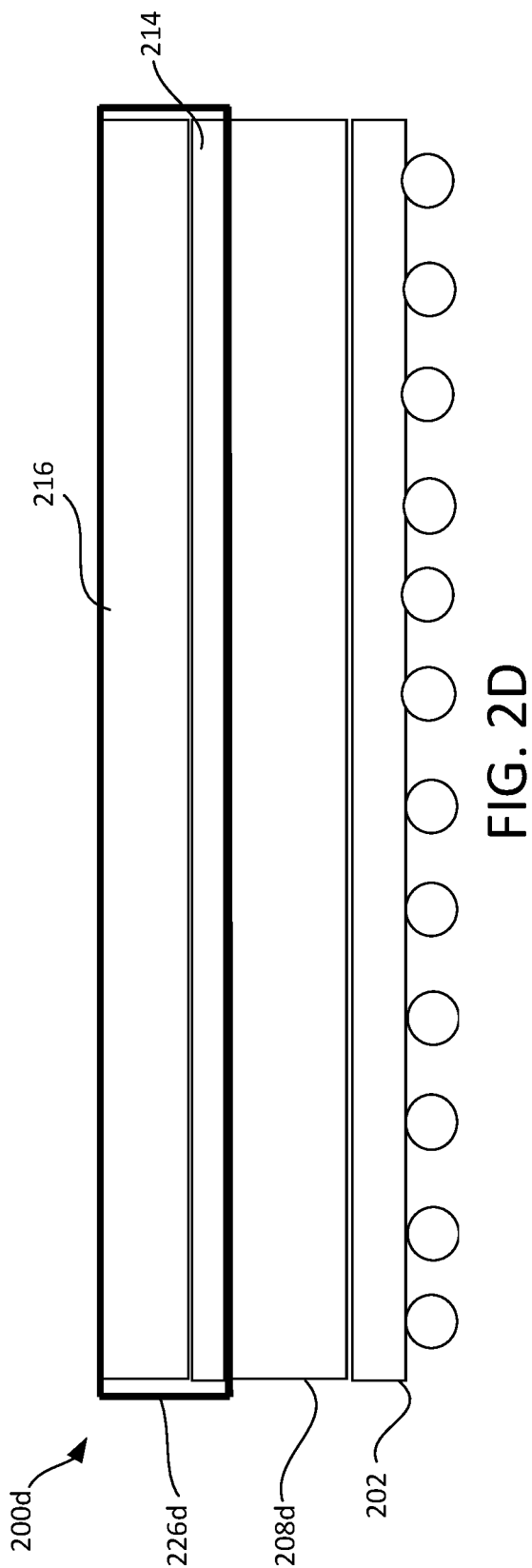

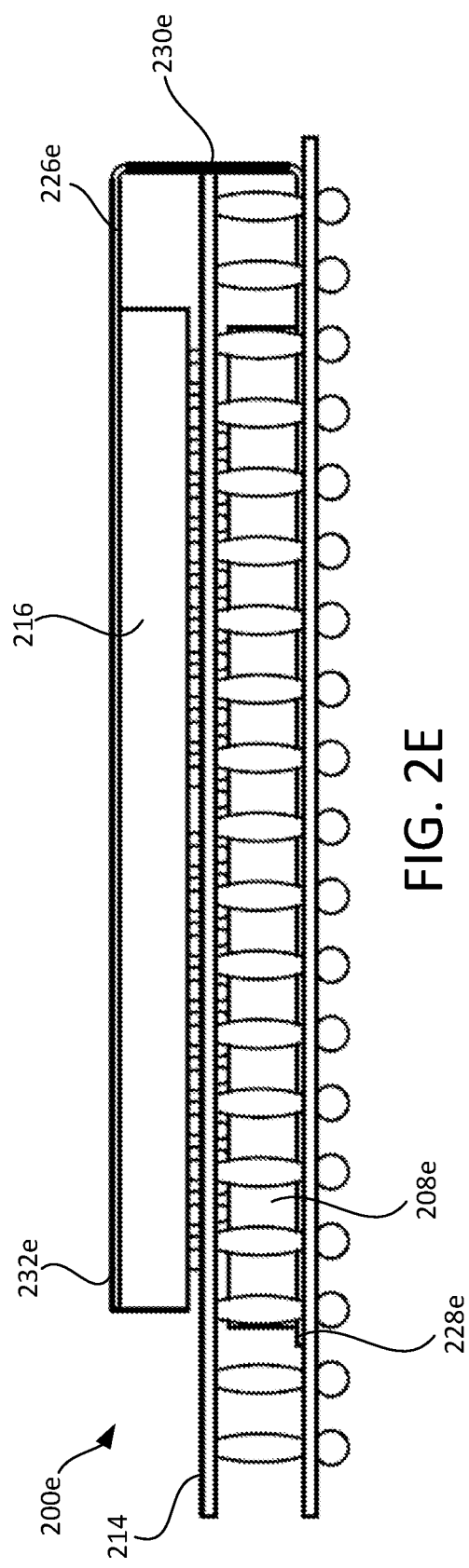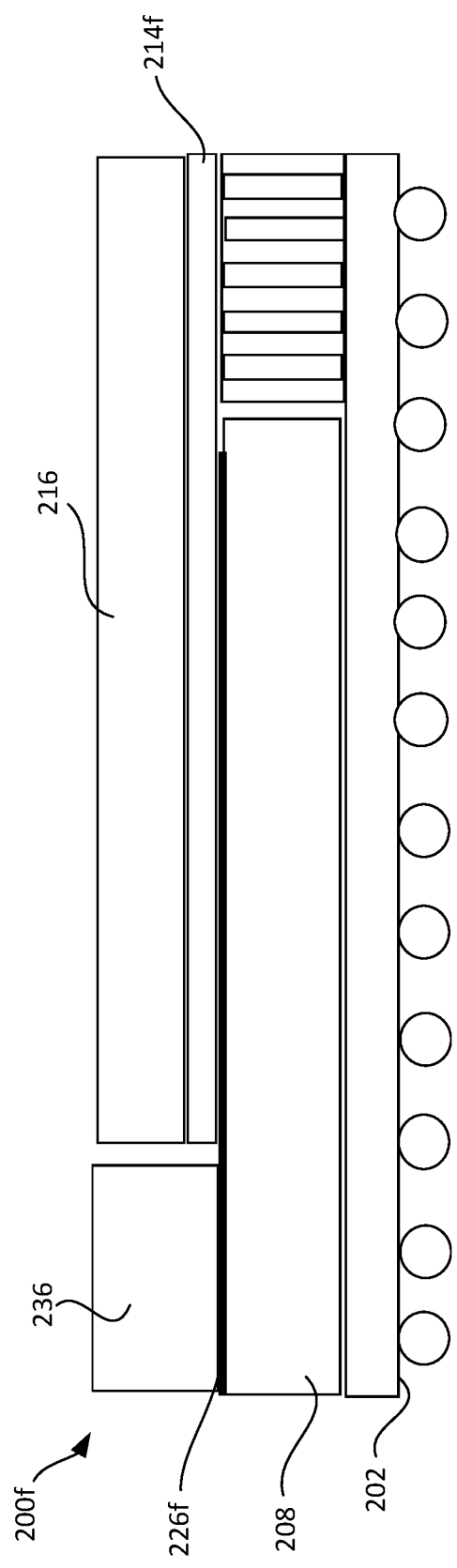

THERMAL MANAGEMENT FOR PACKAGE ON PACKAGE ASSEMBLY

TECHNICAL FIELD

The present technology relates to components and apparatuses for electronic devices. More specifically, the present technology relates to package on a package designs for improved thermal management.

BACKGROUND OF THE INVENTION

Electronic devices, especially smaller electronic devices, often utilize package on a package design techniques to package device components in smaller areas to enable smaller electronic devices to be manufactured. During operation, these components may generate large amounts of heat, which may exceed the operating temperature range of one or more components within a package on a package assembly. This excess heat may cause the various components to fail and/or otherwise operate at suboptimal levels. Even small temperature increases may create such defects.

Thus, there is a need for improved thermal management within package on a package assemblies to ensure that excess heat may be dissipated from the package on a package assembly. These and other needs are addressed by the present technology.

BRIEF SUMMARY OF THE INVENTION

Exemplary package on package (PoP) assemblies may include a substrate. The PoP assemblies may include a first package positioned on a first side of the substrate with a bottom surface of the first package facing the substrate. The PoP assemblies may include a second package positioned on a second side of the substrate with a top surface of the second package facing the substrate. The second side may be positioned opposite the first side. The PoP assemblies may include a conductive element that contacts one or both of a top surface and the bottom surface of the second package and extends to a position that is aligned with or above a top surface of the first package.

In some embodiments, the conductive element may have a thermal conductivity of at least about 100 W/m K. The conductive element may include one or both of graphite and graphene. The PoP assemblies may include a heat dissipation element thermally coupled with a portion of the conductive element that is proximate to the top surface of the second package. A first end portion of the conductive element may be positioned against one of the top surface and the bottom surface of the second package. A second end portion of the conductive element may be aligned with or above the top surface of the first package. A medial portion of the conductive element may wrap around a lateral edge of the substrate. The second end portion may be positioned atop the top surface of the first package. The medial portion may wrap around a lateral edge of the first package. The conductive element may wrap around at least two lateral sides of the substrate. The PoP assemblies may include a support structure positioned alongside of the first package on the first side of the substrate. The conductive element may be coupled with the support structure. A portion of the conductive element may be positioned on a side of the support structure that is opposite the substrate. The conductive element has a thickness of less than about 500 microns.

Some embodiments of the present technology may encompass PoP assemblies. The PoP assemblies may include a substrate. The PoP assemblies may include a first package positioned on a first side of the substrate with a bottom surface of the first package facing the substrate. The PoP assemblies may include a second package positioned on a second side of the substrate with a top surface of the second package facing the substrate. The second side may be opposite the first side. The PoP assemblies may include a conductive element that contacts one or both of a top surface and the bottom surface of the second package. The PoP assemblies may include a heat dissipation element positioned on a top side of the first package. The heat dissipation element may be thermally coupled with the conductive element.

In some embodiments, the heat dissipation element may include one or more selected from the group consisting of a heat pipe, a heat sink, and a device case. The PoP assemblies may include a thermal slug positioned between the conductive element and the heat dissipation element. A top portion of the conductive element may extend over at least a portion of a top surface of the first package. A top portion of the conductive element may extend along an entire length of a top surface of the first package. The PoP assemblies may include an additional substrate positioned on the bottom surface of the second package. The PoP assemblies may include a plurality of terminals extending between the substrate and the additional substrate. The conductive element may extend through a gap formed between at least some of the plurality of terminals.

Some embodiments of the present technology may encompass PoP assemblies. The PoP assemblies may include a substrate. The PoP assemblies may include a memory package positioned on a first side of the substrate with a bottom surface of the memory package facing the substrate. The PoP assemblies may include a logic package positioned on a second side of the substrate with a top surface of the logic package facing the substrate. The second side may be positioned opposite the first side. The PoP assemblies may include a conductive element that contacts one or both of a top surface and the bottom surface of the logic package and extends to a position that is aligned with or above a top surface of the memory package.

In some embodiments, the logic package may include at least one item selected from the group consisting of a graphical processing unit, a video processing unit, and a central processing unit. A width of the conductive element may vary across a length of the conductive element. A thickness of the conductive element may vary across a length of the conductive element.

Such technology may provide numerous benefits over conventional systems and techniques. For example, embodiments of the present technology may provide PoP assemblies that include a conductive element to thermally couple a lower package with a heat dissipation element. Such designs may provide a heat transfer path that largely or entirely bypasses an upper package and provides improved thermal management relative to conventional PoP assemblies. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 2A shows a schematic cross-sectional side elevation view of a PoP assembly according to some embodiments of the present technology.

FIG. 2B shows a schematic cross-sectional side elevation view of a PoP assembly according to some embodiments of the present technology.

FIG. 2C shows a schematic cross-sectional side elevation view of a PoP assembly according to some embodiments of the present technology.

FIG. 2D shows a schematic cross-sectional side elevation view of a PoP assembly according to some embodiments of the present technology.

FIG. 2E shows a schematic cross-sectional side elevation view of a PoP assembly according to some embodiments of the present technology.

FIG. 2F shows a schematic cross-sectional side elevation view of a PoP assembly according to some embodiments of the present technology.

Figures 1A, 1B:
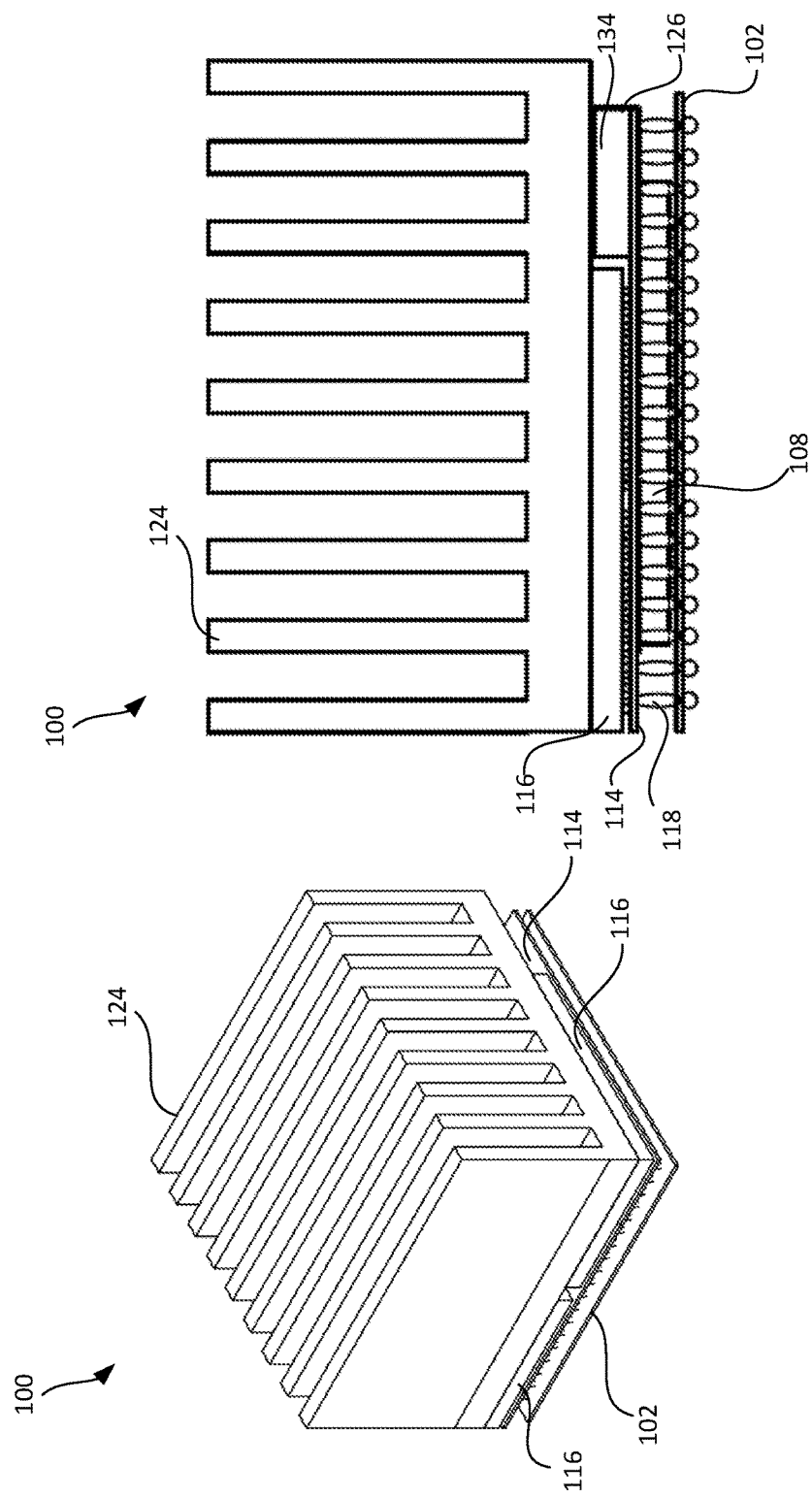
FIG. 1A shows an isometric view of an exemplary package on a package (PoP) assembly according to some embodiments of the present technology.
FIG. 1B shows a schematic cross-sectional side elevation view of the PoP assembly of FIG. 1A.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Electronic devices may utilize package on a package (PoP) assemblies to stack two or more electronic components (packages) to increase the component density. The greater component density may enable more packages to be positioned within smaller footprints, which may enable device sizes to be reduced. Additionally, PoP assemblies may enable shorter data lines to be used to connect components, such as logic units and memory units, which may increase processing speeds.

Oftentimes, the various packages in a PoP assembly may have different operating temperatures. For example, PoP assemblies may include one package that includes a logic device that is in stacked arrangement with an upper package that includes a memory device. The logic device may be rated for higher operating conditions than the memory device. Additionally, the logic device may generate heat that exceeds the operating temperature of the memory device. This may cause the memory device to wear out, operate at a sub-optimal capacity, and/or cause other performance issues.

Conventionally, PoP assemblies may be coupled with or include one or more heat dissipation elements (such as heat sinks, heat pipes, device cases, etc.) that are coupled with a memory package (or other heat sensitive package) to dissipate heat to combat the thermal effects associated with heat generating components (such as logic devices). However, memory devices (and some other packages) may not be good thermal conductors, which prevents the heat from the logic device from effectively transferring to the heat dissipation elements. As such, merely coupling a heat dissipation element with a memory device package may not be sufficient to dissipate excess heat without overheating the memory device.

The present technology overcomes these challenges by utilizing a conductive element that dissipates heat from a logic device (or other package) to a heat dissipation element, while largely or completely bypassing the memory device (or other package). For example, the conductive element may be used to directly or indirectly thermally couple a lower package with the heat dissipation element. This may create a heat dissipation path that avoids or largely avoids contact with the upper package. This may enable various packages to be used in a PoP assembly with larger operating temperature differences between the various components. Additionally, components that generate high levels of heat may be more easily integrated into PoP assemblies.

Although the remaining disclosure will routinely identify specific package on a package configurations utilizing the disclosed technology, it will be readily understood that the systems and methods are equally applicable to other package on a package assemblies. Accordingly, the technology should not be considered to be so limited as for use with these specific package on a package assemblies. The disclosure will discuss several possible package on a package configurations according to embodiments of the present technology before additional variations and adjustments to this system according to embodiments of the present technology are described.

FIGS. 1A-1D illustrate an exemplary embodiment of a PoP assembly 100. PoP assembly 100 may include a substrate 102 that may support one or more packages of the PoP assembly 100. The substrate 102 may have any shape and/or size. For example, the substrate 102 may be generally rectangular, circular, elliptical, and/or may have any other shape. As illustrated in the side elevation views of FIGS. 1B and 1D, the substrate 102 may include a top surface 104 and a bottom surface 106. In some embodiments, the substrate 102 may be a laminate substrate, such as a printed circuit board (PCB), although other forms of substrates are possible in various embodiments.

A lower package 108 may be mounted on the substrate 102. For example, the lower package 108 may be coupled with a top surface of the substrate 102 using a number of ball grid array (BGA) balls, which may both physically and electrically couple the lower package 108 with the substrate 102. The lower package 108 may include a top surface 110 and a bottom surface 112. The bottom surface 112 may be directly or indirectly affixed to the top surface 104 of the substrate 102 via the BGA balls and/or other coupling mechanisms.

The lower package 108 may include one or more electronic components. For example, the lower package 108 may be selected from logic devices, memory devices, and/or other electronic components. Logic devices may include central processing units (CPUs), graphical processing units (GPUs), video processing units (VPUs), accelerated processing units (APUs) and the like. Memory devices may include random access memory (RAM) (such as static RAM (SRAM), dynamic RAM (DRAM), single data rate synchronous dynamic RAM (SDR SDRAM), Double Data Rate Synchronous Dynamic RAM (DDR SDRAM, DDR2, DDR3, DDR4), graphics double data rate synchronous dynamic RAM (GDDR SDRAM, GDDR2, GDDR3, GDDR4, GDDR5), flash memory, and the like) and/or other memory devices.

The PoP assembly 100 may include an additional substrate 114 that may be positioned proximate the top surface 110 of the lower package 108. The substrate 114 may be similar to the substrate 102 or may be different in some embodiments. For example, the substrate 114 may be a laminate substrate, PCB, and/or other substrate. Oftentimes, the size and/or shape of substrates 102 and 114 may be the same or similar (such as having lateral dimensions that are within 10% of one another). This may enable the PoP assembly 100 to have a generally uniform shape even if packages of different sizes and/or shapes are included in the PoP assembly 100.

Figure 1C:
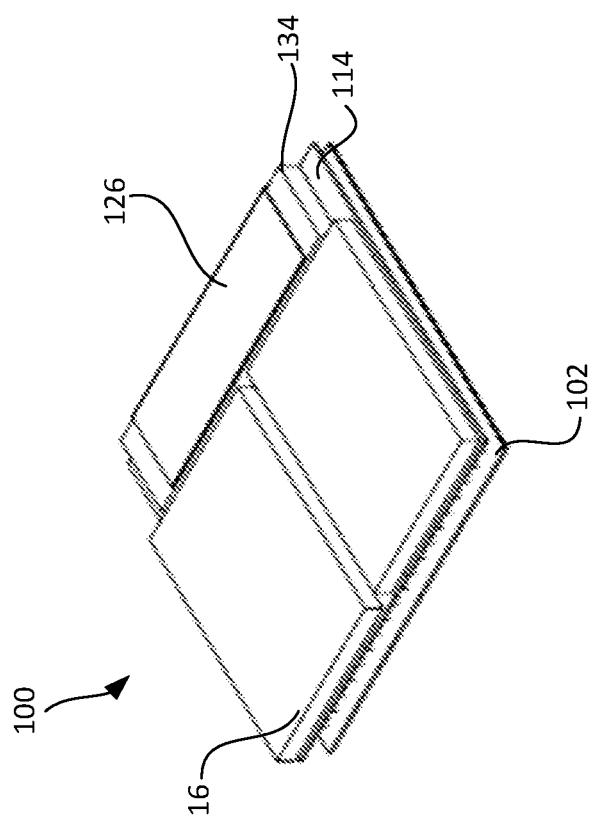
FIG. 1C shows an isometric view of the PoP assembly of FIG. 1A without a heat dissipation element.
Figure 1D:
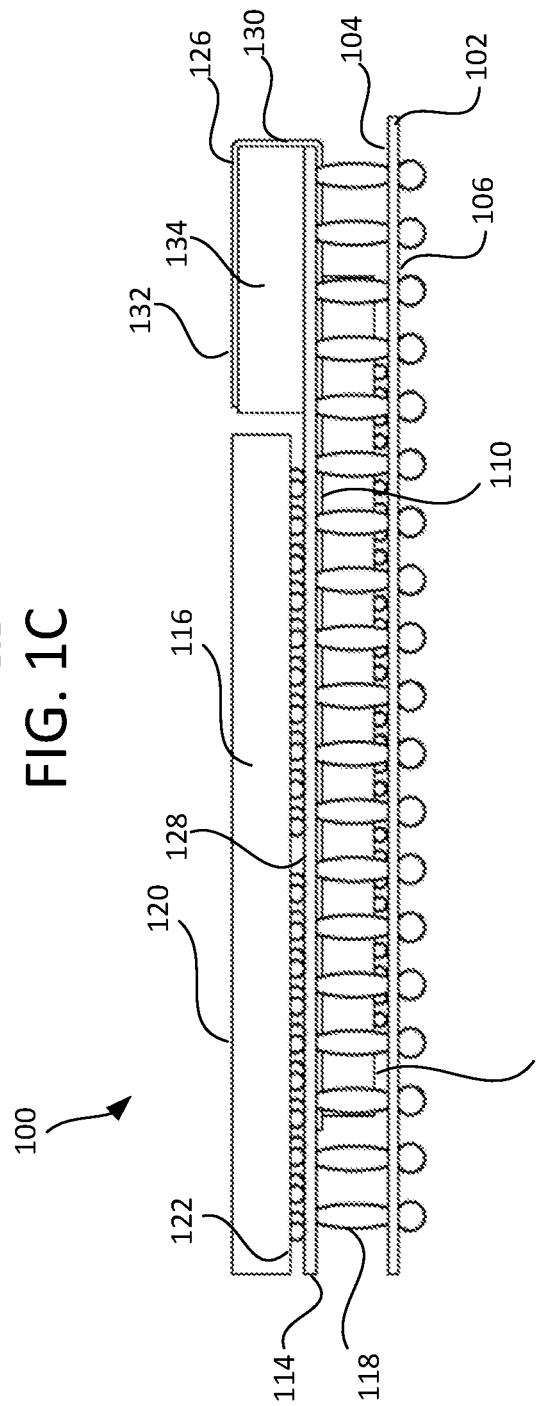
FIG. 1D shows a schematic cross-sectional side elevation view of the PoP assembly of FIG. 1A without a heat dissipation element.

The PoP assembly 100 may include a upper package 116 that is positioned on a top surface of the substrate 114. For example, the upper package 116 may be coupled with a top surface of the substrate 114 using a number of BGA balls and/or other connectors, which may both physically and electrically couple the upper package 116 with the substrate 114. The upper package 116 may include a top surface 120 and a bottom surface 122. The upper package 116 may include one or more electronic components. For example, the upper package 116 may be selected from logic devices, memory devices, and/or other electronic components. The upper package 116 may be identical or the same as the lower package 108 (e.g., both the same or different logic devices or the same or different memory devices, etc.) or the two packages may be different. For example, in a particular embodiment the lower package 108 may include a logic device and the upper package 116 may include a memory device. Oftentimes, a logic device is provided as the lower package 108, as the logic device needs many more BGA connections to the motherboard or other circuit board than a memory device. Additionally, this may enable connections between the logic device and motherboard (or other circuit board) to be shorter, which may facilitate higher processing speeds. The number of components within each package may be the same or different. For example, a single logic device may be included in the lower package 108, while the upper package 116 includes two or more memory devices as illustrated in FIGS. 1A and 1C. The lower package 108 and the upper package 116 may have the same or similar dimensions or may have different dimensions.

A number of terminals 118 may extend between substrate 102 and substrate 114, which may electrically couple the lower package 108 and/or upper package 116 with a PCB and/or motherboard. The terminals 118 may be any electrical connector. In a particular embodiment, the terminals 118 may include BGA balls. The terminals 118 may be positioned laterally outward of the lower package 108 and may be positioned around a portion of the periphery of the lower package 108. In some embodiments, the terminals 118 may be positioned at regular and/or irregular intervals about the periphery of the lower package 108. One or more large gaps may be provided between a portion of the terminals 118. For example, a large gap may be provided on one or more lateral ends of the lower package 108.

The PoP assembly 100 may include one or more heat dissipation elements 124 that are positioned proximate the upper package 116. For example, the heat dissipation element 124 may be positioned directly or indirectly against the top surface 120 of the upper package 116. The heat dissipation element 124 may include a heat sink (shown here), heat tube, and/or other component that may be used to dissipate heat from the PoP assembly 100. In some embodiments, the heat dissipation element 124 may include a housing or case of an electronic device in which the PoP assembly is provided. For example, a mobile phone or tablet computer shell or housing may be utilized as a heat dissipation element 124 in various embodiments. While illustrated with only one heat dissipation element 124 positioned on the top surface 120 of the upper package 116, it will be appreciated that any number and/or type of heat dissipation elements 124 may be used, and some may be at different locations relative to the PoP assembly 100. As just one example, the heat dissipation element 124 may be offset and/or otherwise remotely located from the PoP assembly 100 in some embodiments.

The PoP assembly 100 may include one or more conductive elements 126 that may thermally couple the lower package 108 with the heat dissipation element 124. The conductive element 126 may contact one or more surfaces of the lower package 108 and extend to a position that is aligned with or above the top surface of the upper package 116 where a top surface of the conductive element 126 may be coupled with the heat dissipation element 124 to complete a heat transfer path between the lower package 108 and the heat dissipation element 124. For example, the conductive element 126 may have a lower end portion 128 that is coupled with the lower package 108, a medial portion 130 that extends around an edge of the substrate 114, and an upper end portion 132 that is coupled with the heat dissipation element 124. The lower end portion 128 may be coupled with the top surface 110, bottom surface 112, and/or one or more side surfaces of the lower package 108. For example, the lower end portion 128 may be coupled with a surface of the lower package 108 that does not include BGA balls (or other connectors). The medial portion 130 may travel upward and around a lateral surface of the substrate 114, with a top surface of the upper end portion 132 being aligned with and/or positioned above the top surface of the upper package 116. The lower end portion 128 of the conductive element 126 may extend along all or a portion of a length of the lower package 108, with larger contact areas providing greater heat dissipation capabilities. The conductive element 126 may pass through one or more gaps formed between terminals 118, such as through large gaps formed on one or more lateral ends of the lower package 108. In some embodiments, the conductive element 126 may define one or more slots, gaps, and/or apertures that enable the conductive element 126 to surround one or more of the terminals 118. For example, one or more terminals 118 may be positioned within one or more of the slots, gaps, and/or apertures formed in the conductive element 126.

The conductive element 126 may be formed from a material that has a high thermal conductivity, such as a metal and/or carbon-based material. For example, the conductive element may have a thermal conductivity of at least or about 100 W/m K, at least or about 200 W/m K, at least or about 300 W/m K, at least or about 400 W/m K, at least or about 500 W/m K, at least or about 600 W/m K, at least or about 700 W/m K, at least or about 800 W/m K, at least or about 900 W/m K, at least or about 1000 W/m K, at least or about 2000 W/m K, at least or about 3000 W/m K, at least or about 4000 W/m K, at least or about 5000 W/m K, or more. In some embodiments, the conductive element 126 may include aluminum, copper, graphite, graphene, and/or other highly conductive material. In some embodiments, a thickness of the conductive element 126 may be constant along a length of the conductive element 126. In such instances, the thickness may be less than or about 500 microns, less than or about 400 microns, less than or about 300 microns, less than or about 200 microns, less than or about 100 microns, less than or about 50 microns or less. Oftentimes, thinner conductive elements 126 (such as those that are less than or about 200 microns) may be formed of materials having a thermal conductivity of at least or about 1000 W/m K, as such highly conductive materials may better facilitate heat exchange when used in such small quantities of material.

In some embodiments, the conductive element 126 may have a variable thickness across a length of the conductive element 126, with at least one of the lower end portion 128, medial portion 130, and/or upper end portion 132 having a different thickness that another portion. As just one example, the lower end portion 128 may have a thickness of less than about 200 microns, while the upper end portion 132 may have a thickness of between about 500 microns and 1000 microns. This may enable the lower end portion 128 and lower package 108 to fit between substrates 102 and 114 without increasing (or minimally increasing) a distance between the substrates 102 and 114, while the upper end portion 132 may be thicker to increase the amount of heat that may be transferred from the lower package 108 to the heat dissipation element 124. In some embodiments, to accommodate a thicker upper end portion 132, a thickness of the support structure 134 may be reduced and/or the support structure 134 may be removed entirely to enable a top surface of the upper end portion 132 to be substantially aligned with the top surface of the upper package 116. The thickness of the conductive element 126 may vary in a stepped fashion and/or transitions between different thicknesses may be tapered in a uniform or non-uniform manner.

By using a conductive element 126 having a high thermal conductivity to thermally couple the lower package 108 with one or more heat dissipation elements 124, embodiments of the present invention may provide heat paths that enable heat to be dissipated from the lower package 108 while largely thermally decoupling the lower package 108 and upper package 116. This enables heat from the lower package 108 to be dissipated away from the upper package 116 and may result in lower operating temperatures for the upper package 116. For example, the conductive element 126 may provide a heat transfer path that largely or entirely bypasses the upper package 116. This may enable the lower package 108 (such as a logic device) to operate at a higher capacity (which generate additional heat), without transferring large amounts of heat to the upper package 116 (such as a memory device, which may be more heat sensitive than the lower package 108). This may enable the packages to function at a higher level, even when there is a mismatch in operating temperatures of the components within each package. In a particular embodiment using a graphene conductive element 126, a temperature of the lower package 108 may be reduced by greater than or about 5° C., greater than or about 10° C., greater than or about 11° C., greater than or about 12° C., greater than or about 13° C., greater than or about 14° C., greater than or about 15° C., or more due to improved heat transfer to the heat dissipation element 124 via the conductive element 126. Similarly, a temperature of the upper package 116 may be reduced by greater than or about 1° C., greater than or about 2° C., greater than or about 3° C., greater than or about 4° C., greater than or about 5° C., or more.

In some embodiments, the upper end portion 132 of the conductive element 126 may be positioned atop a support structure 134. For example, the support structure 134 may be positioned on a top surface of the substrate 114 alongside the upper package 116. A top surface of the upper end portion 132 of the conductive element 126 may be positioned atop a top surface of the support structure 134. Oftentimes, the support element 134 and upper end portion 132 of the conductive element 126 may have a combined thickness that substantially matches a thickness of the upper package 116, such that the top surface of the upper end portion 132 of the conductive element 126 is aligned with or substantially aligned with (such as within about 10 microns) the top surface of the upper package 116. This may enable a heat dissipation structure 124 having a generally flat bottom surface to be coupled with top surfaces of both the upper end portion 132 of the conductive element 126 and the upper package 116. The support structure 134 may be formed of any material. In some embodiments, the support structure 134 may be a thermal slug formed from a conductive material, such as a metal, which may assist in exchanging heat from the lower package 108 to the heat dissipation element 124.

While described as being one unit, it will be appreciated that a conductive element 126 may include any number of components that, together, form a conductive path to thermally couple the lower package 108 with the heat dissipation element 124. Additionally, while shown with two packages, it will be appreciated that any number of packages may be provided in a given PoP assembly, with any number of conductive elements to dissipate heat in a controlled manner away from heat-sensitive components.

While shown with the conductive element 126 extending from a top surface of the lower packaging, folding around a lateral side of substrate 114 and being supported atop a support structure 134 positioned alongside the upper package 116, it will be appreciated that other configurations of conductive elements are possible. FIGS. 2A-2I illustrate exemplary embodiments of PoP assemblies 200. FIGS. 2A-2I may include one or more components discussed above with regard to FIGS. 1A-1D, and may illustrate further details relating to that PoP assembly 100. PoP assemblies 200 are understood to include any feature or aspect of PoP assembly 100 discussed previously. For example, each PoP assembly 200 may include one or more heat dissipation elements that are thermally coupled with a conductive element 226.

As shown in FIG. 2A, PoP assembly 200a may include a substrate 202 above which a lower package 208a may be positioned. A substrate 214 may be positioned above the lower package 208a, with an upper package 216 being supported atop the substrate 214. A number of terminals 218 may extend between substrate 202 and substrate 214 and may electrically couple the lower package 208 and/or upper package 216 with a PCB and/or motherboard. As illustrated, the lower package 208a may be positioned upside down, such that the lower package 208 is coupled with a bottom surface of the substrate 214 using a number of ball grid array (BGA) balls. This may enable a bottom-facing (top side) surface of the upside down lower package 208a to be devoid of connective elements. In such an embodiment, a conductive element 226a to be coupled with the bottom-facing (top side) surface of the upside down lower package 208a. A medial portion 230a of the conductive element 226a may fold upward about a lateral edge of the lower package 208a and substrate 214, with an upper end portion 232a of the conductive element 226a being positioned atop a support structure 234a that is positioned alongside the upper package 216. A top surface of the upper end portion 232a may be aligned with or above a top surface of the upper package 216.

In some embodiments, a conductive element may wrap around at least two lateral sides of a substrate. For example, as illustrated in FIG. 2B a PoP assembly 200b may include a conductive element 226b positioned against a top surface of the lower package 208b. A medial portion 230b of the conductive element 226b may be positioned against the top surface of the lower package 208b, while opposing ends of the conductive element 226b may be folded up and around opposing lateral sides of the substrate 214. Each end may be positioned atop its own support structure 234b, which may enable a top surface of each end to be aligned with or above a top surface of the upper package 216. Each end of the conductive element 226b may pass through a gap formed between one or more terminals (not shown). While shown with the conductive element 226b extending about two opposing lateral sides of the substrate 214, in some embodiments, the conductive element 226b may extend about two or more adjacent lateral sides of the substrate 214, and in some embodiments may extend about all lateral sides of the substrate 214.

In some embodiments, a conductive element may be positioned atop an upper package, rather than being atop a support structure. For example, FIG. 2C illustrates a PoP assembly 200c having a conductive element 226c positioned against a top surface of the lower package 208c. A medial portion 230c of the conductive element 226c may be positioned against the top surface of the first package 208c, while opposing ends of the conductive element 226c may be folded up and around opposing lateral sides of the substrate 214. Each end may be extend over an end and/or medial portion of the upper package 216. A heat dissipation element (not shown) may be positioned against a top surface of each end of the conductive element 226c without contacting the upper package 216. Each end of the conductive element 226c may pass through a gap formed between one or more terminals 218. FIG. 2D illustrates a PoP assembly 200d having a conductive element 226d that forms a sleeve that extends across an entire length of top surfaces of both the lower package 208d and the upper package 216. For example, an interior of the sleeve may encircle the substrate 214 and upper package 216. In such embodiments, a heat dissipation element may be positioned against a top surface of the conductive element 226d and may be spaced apart from a top surface of the upper package 216. FIG. 2E illustrates a PoP assembly 200e having a conductive element 226e positioned against a bottom surface of the lower package 208e. A lower end portion 228e of the conductive element 226e may be positioned against the bottom surface of the first package 208e, while a medial portion 230e of the conductive element 226e may be folded up and around a lateral side of the substrate 214 with a top end portion 232e of the conductive element 226e being supported atop the upper package 216 (without a support element or thermal slug). The conductive element 226e may extend over all or a portion of the stop surface of the upper package 216. A heat dissipation element (not shown) may be positioned against a top surface of the conductive element 226e without contacting the upper package 216.

Figure 2G:
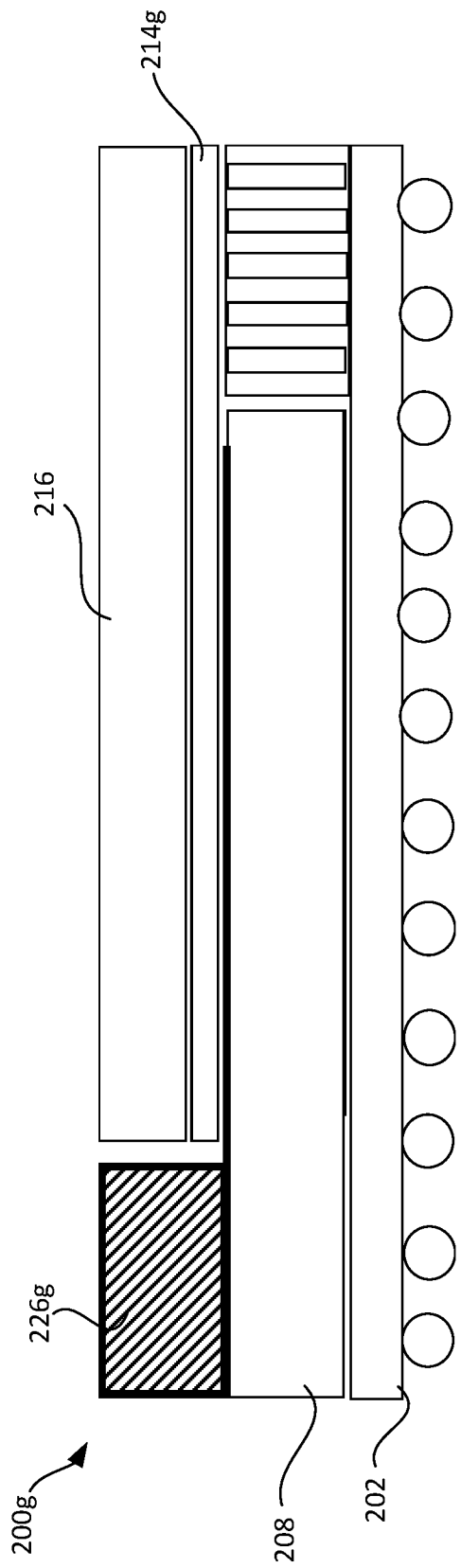
FIG. 2G shows a schematic cross-sectional side elevation view of a PoP assembly according to some embodiments of the present technology.

In some embodiments, the substrates may have different sizes. As illustrated in FIG. 2F, PoP assembly 200f may include a substrate 214f that is shorter than substrate 202. A conductive element 226f may be positioned along all or a portion of a top surface of the lower package 208. The conductive element 226f may be generally flat, with a distal end of the conductive element 226f extending beyond an edge of the substrate 214f and the upper package 216. A thermal slug 236 may be coupled with a top surface of the conductive element 226f, with the thermal slug 236 projecting upward from the conductive element 226e and being positioned alongside the substrate 214f and the upper package 216. The thermal slug 236 may be formed of a conductive material and may operate in conjunction with the conductive element 226f to transfer heat from the lower package 208 to a heat dissipation element, while avoiding the upper package 216. The thermal slug 236 may be formed of a same or a different conductive material than the conductive element 226f. FIG. 2G illustrates a PoP assembly 200g having a substrate 214g that is shorter than substrate 202. A conductive element 226g may be positioned along all or a portion of a top surface of the lower package 208. The conductive element 226g may have a thickness that varies. For example, a portion of the conductive element 226g may be positioned beneath the substrate 214 and may have a first thickness that is less than or about 200 microns, less than or about 150 microns, less than or about 100 microns, less than or about 50 microns, or less. A portion of the conductive element 226g may extend laterally beyond a distal edge of the substrate 214 and upper package 216. This portion of the conductive element 226g may have a larger thickness. For example, a thickness of this portion of the conductive element 226g may substantially match a combined thickness of the substrate 214 and upper package 216 such that a top surface of the conductive element 226g is substantially planar with a top surface of the upper package 216. In some embodiments, the thickness of the thicker portion of the conductive element 226g may be greater than or about 500 microns, greater than or about 750 microns, greater than or about 1000 microns, or more. The transition between regions of the conductive element 226g with different thicknesses may be stepped as illustrated in FIG. 2G and/or may be gradual.

Figure 2H:
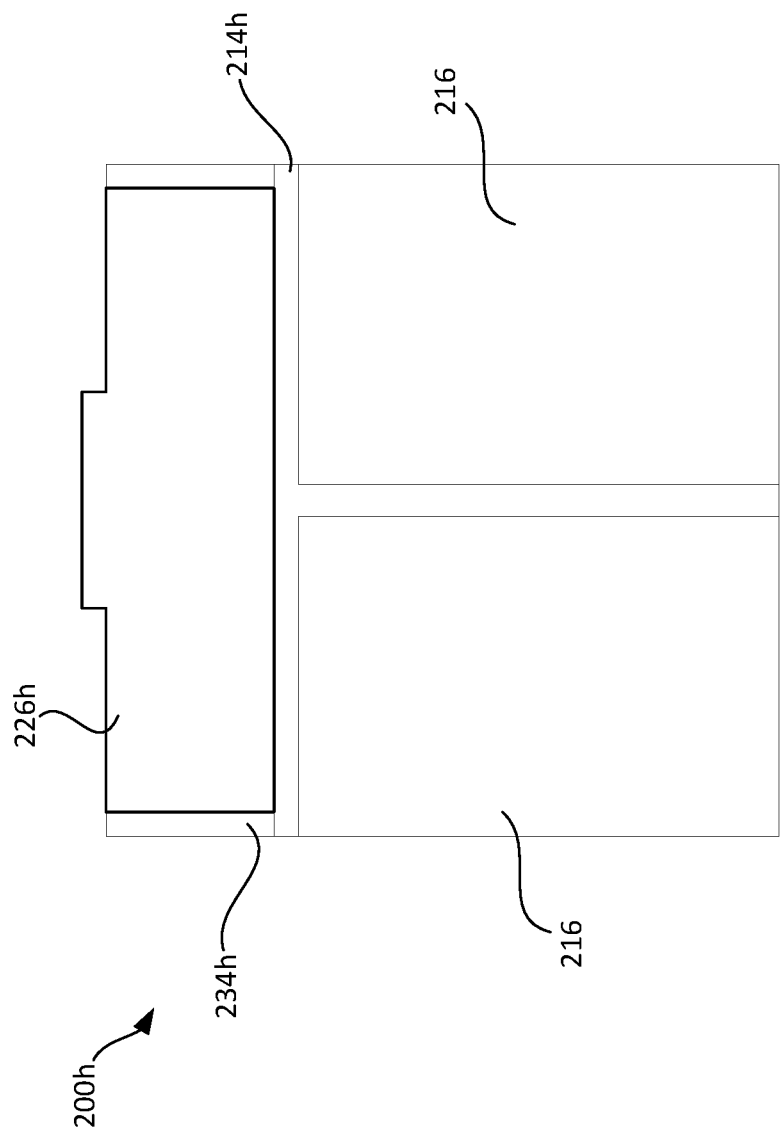
FIG. 2H shows a schematic top plan view of a PoP assembly according to some embodiments of the present technology.

In some embodiments, a width of a conductive element may vary along a length of the conductive element. FIG. 2H illustrates a top elevation view of a PoP assembly 200h that has a conductive element 226h having a variable width. For example, a medial portion of the conductive element 226h may be thinner than one or both ends of the conductive element 226h. As illustrated, the top end of the conductive element 226h is positioned atop a support element 234h and has a greater width than a medial portion of the conductive element 226h. This may enable the medial portion to be thinner to fit through smaller gaps between terminals (such as terminals 218), while still providing a large surface area for transferring heat to a heat dissipation element. The transition between regions of the conductive element 226h with different widths may be stepped as shown and/or may be gradual.

Figure 2I:
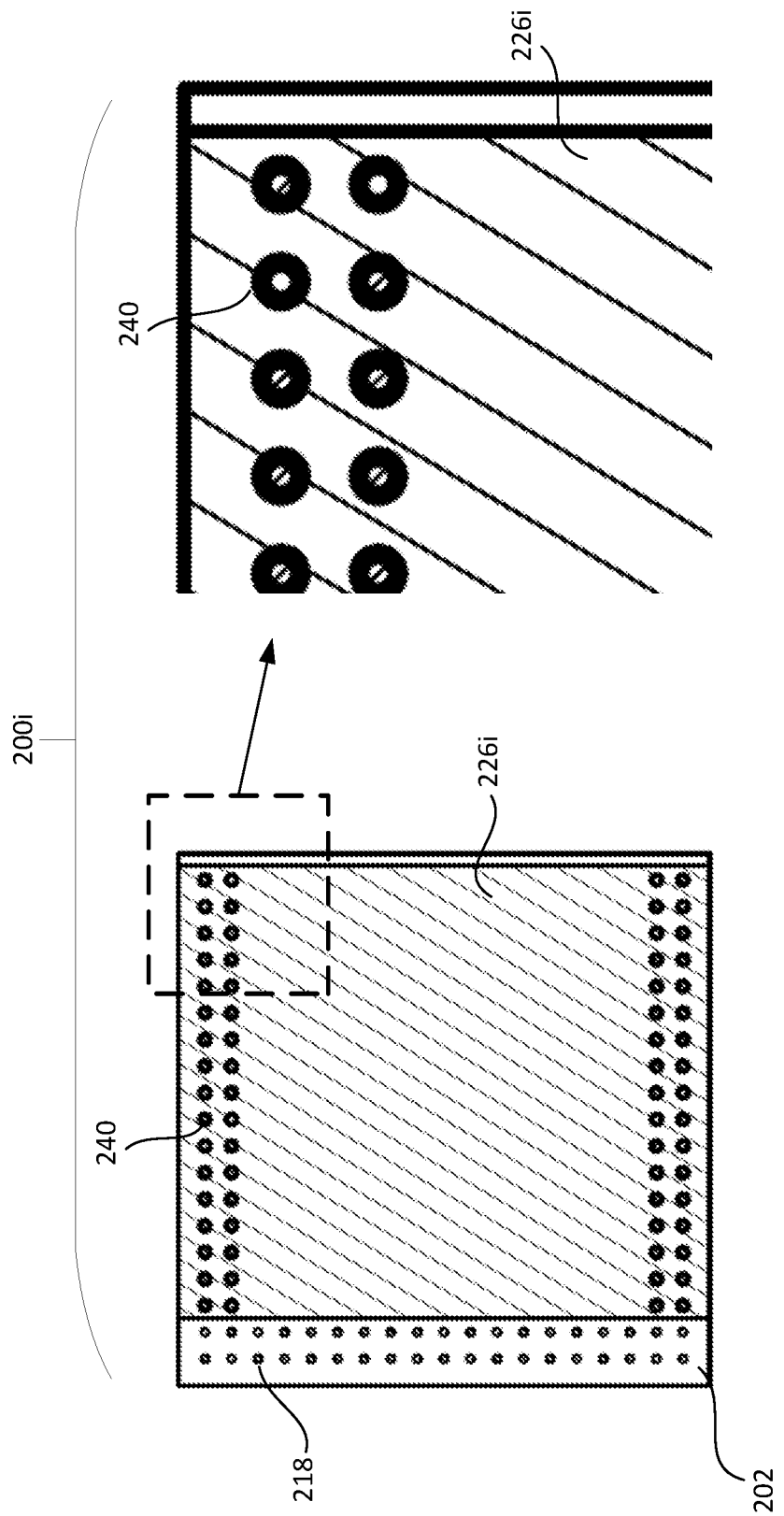
FIG. 2I shows a schematic top plan view of a PoP assembly according to some embodiments of the present technology.

In some embodiments, it may be desirable to use a wider conductive element than can fit within the gaps formed by terminals 218. For example, a wider conductive element may provide more material and/or surface area through which heat may be conducted away from the lower package 208 to a heat dissipation device. FIG. 2I illustrates a top elevation view of a PoP assembly 200i that has a conductive element 226i having a width that exceeds a spacing formed between adjacent terminals 218 positioned on a substrate 202. As illustrated, the conductive element 226i may define a number of apertures 240. The apertures 240 may be sized and positioned to receive one or more of the terminals 218. In the illustrated embodiment, each aperture 240 is sized and positioned to receive a single terminal 218. However, in some embodiments one or more of the apertures 240 may be larger in size and may receive multiple terminals 218. By providing apertures 240 within the conductive element 226i, the size of the conductive element 226i may be increased without modifying an existing terminal configuration.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. It will be appreciated that features from the various PoP assemblies described above may combined and/or omitted in any number of combinations in accordance with the present invention.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the opening" includes reference to one or more openings and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A package on package assembly, comprising:
a substrate;
a first package positioned on a first side of the substrate with a bottom surface of the first package facing the substrate;
a second package positioned on a second side of the substrate with a top surface of the second package facing the substrate, the second side being positioned opposite the first side;
a conductive element that contacts one or both of a top surface and the bottom surface of the second package and extends to a position that is aligned with or above a top surface of the first package;
a support structure positioned on the first side of the substrate positioned alongside of the first package, and
a heat dissipation structure coupled with the top surface of the first package and disposed above the support structure.

2. The package on package assembly of claim 1, wherein:
the conductive element has a thermal conductivity of at least about 100 W/m K.

3. The package on package assembly of claim 1, wherein:
the conductive element comprises one or both of graphite and graphene.

4. The package on package assembly of claim 1, wherein the heat dissipation structure is thermally coupled with a portion of the conductive element that is proximate to the top surface of the second package.

5. The package on package assembly of claim 1, wherein:
a first end portion of the conductive element is positioned against one of the top surface and the bottom surface of the second package;
a second end portion of the conductive element is aligned with or above the top surface of the first package; and
a medial portion of the conductive element wraps around a lateral edge of the substrate.

6. The package on package assembly of claim 5, wherein:
the second end portion is positioned atop the top surface of the first package; and
the medial portion wraps around a lateral edge of the first package.

7. The package on package assembly of claim 1, wherein:
the conductive element wraps around at least two lateral sides of the substrate.

8. The package on package assembly of claim 1, wherein the conductive element is coupled with the support structure.

9. The package on package assembly of claim 8, wherein:
a portion of the conductive element is positioned on a side of the support structure that is opposite the substrate.

10. The package on package assembly of claim 1, wherein:
the conductive element has a thickness of less than about 500 microns.

11. A package on package assembly, comprising:
a substrate;
a first package positioned on a first side of the substrate with a bottom surface of the first package facing the substrate;
a second package positioned on a second side of the substrate with a top surface of the second package facing the substrate, the second side being opposite the first side;
a conductive element that contacts one or both of a top surface and the bottom surface of the second package;
a support structure positioned on the first side of the substrate positioned alongside of the first package; and a heat dissipation element positioned on a top side of the first package and disposed above the support structure, the heat dissipation element being thermally coupled with the conductive element.

12. The package on package assembly of claim 11, wherein:
the heat dissipation element comprises one or more selected from the group consisting of a heat pipe, a heat sink, and a device case.

13. The package on package assembly of claim 11, wherein the support structure comprises a thermal slug positioned between the conductive element and the heat dissipation element.

14. The package on package assembly of claim 11, wherein:
a top portion of the conductive element extends over at least a portion of a top surface of the first package.

15. The package on package assembly of claim 11, wherein:
a top portion of the conductive element extends along an entire length of a top surface of the first package.

16. The package on package assembly of claim 11, further comprising:
an additional substrate positioned on the bottom surface of the second package; and
a plurality of terminals extending between the substrate and the additional substrate, wherein the conductive element extends through a gap formed between at least some of the plurality of terminals.

17. A package on package assembly, comprising:
a substrate;
a memory package positioned on a first side of the substrate with a bottom surface of the memory package facing the substrate;
a logic package positioned on a second side of the substrate with a top surface of the logic package facing the substrate, the second side being positioned opposite the first side;
a conductive element that contacts one or both of a top surface and the bottom surface of the logic package and extends to a position that is aligned with or above a top surface of the memory package;
a support structure positioned on the first side of the substrate positioned alongside of the memory package; and
a heat dissipation structure coupled with the top surface of the memory package and disposed above the support structure.

18. The package on package assembly of claim 17, wherein:
the logic package comprises at least one item selected from the group consisting of a graphical processing unit, a video processing unit, and a central processing unit.

19. The package on package assembly of claim 17, wherein:
a width of the conductive element varies across a length of the conductive element.

20. The package on package assembly of claim 17, wherein:
a thickness of the conductive element varies across a length of the conductive element.

* * * * *